APPARATUS FOR FORMING AND MOUNTING SOLDER RINGS ON COMPONENT LEADS

Filed Aug. 5, 1963 4 Sheets-Sheet 1

INVENTORS
W.T. NOWELL
E.E. SIMPSON
BY [signature]
ATTORNEY

Oct. 5, 1965 W. T. NOWELL ETAL 3,209,792

APPARATUS FOR FORMING AND MOUNTING SOLDER RINGS ON COMPONENT LEADS

Filed Aug. 5, 1963 4 Sheets-Sheet 2

APPARATUS FOR FORMING AND MOUNTING SOLDER RINGS ON COMPONENT LEADS

Filed Aug. 5, 1963 4 Sheets-Sheet 4

United States Patent Office 3,209,792

Patented Oct. 5, 1965

3,209,792

APPARATUS FOR FORMING AND MOUNTING SOLDER RINGS ON COMPONENT LEADS

Winford Tutin Nowell, Groveland, and Earle Edward Simpson, Georgetown, Mass., assignors to Western Electric Company, Incorporated, New York, N.Y., a corporation of New York Filed Aug. 5, 1963, Ser. No. 299,767

3 Claims. (Cl. 140—93)

This invention relates to apparatus for forming and mounting solder rings on component leads, particularly leads of forms for coil wound resistors.

In the manufacture of certain types of electrical components having cylindrical dielectric portions with leads extending axially from opposite ends thereof, conductive washers are to be mounted on the leads adjacent these dielectric portions and to accomplish this result, the washers are to be preceded by solder rings.

An object of the invention is to provide an apparatus which is simple in structure and highly efficient in forming and mounting solder rings on component leads.

In accordance with the object, the invention comprises an apparatus for forming and mounting solder rings on component leads moved successively into an operating station whereupon means are provided to feed a solder wire to the station, cut predetermined lengths therefrom, form U-shaped bends in the lengths of solder wire, move the U-shaped lengths of wire to straddle successive leads disposed at the operating station and means associated therewith to bend the U-shaped lengths about the leads.

Other objects and advantages will be apparent from the following detailed description when considered in conjunction with the accompanying drawings wherein.

Figure 1:
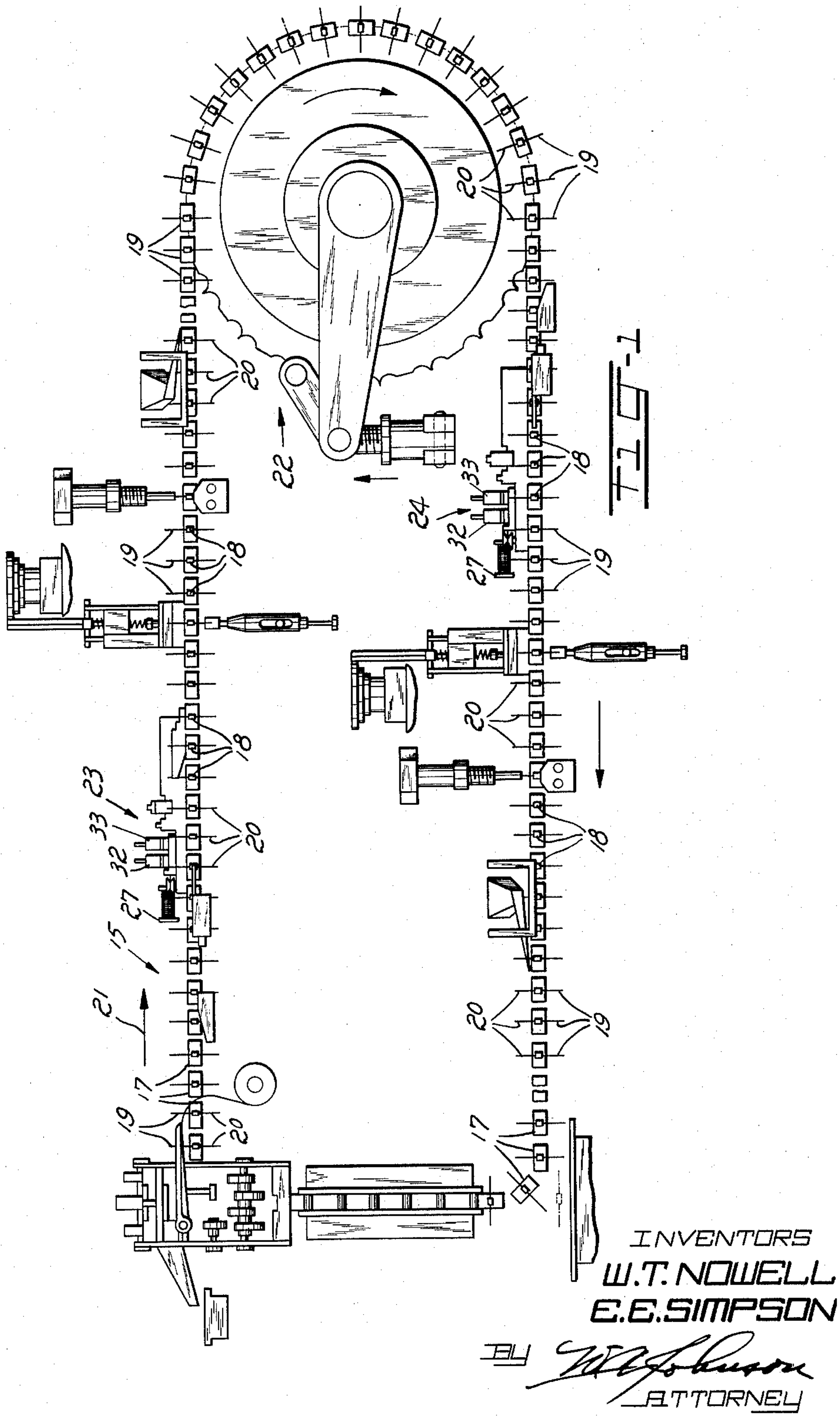
FIG. 1 is a front view of a machine embodying the invention.

The machine, shown in FIG. 1, includes an endless conveyor, indicated generally at 15, composed of an endless chain 16 (FIG. 2) carrying spaced holders 17 for components 18 having leads 19 and 20. The conveyor is moved intermittently in the direction of the arrow 21 (FIG. 1) by suitable means 22 to move the components in the holders relative to operating stations. With the present invention, two stations have like apparatus 23 and 24, respectively, to form and mount solder rings on the respective leads 19 and 20 of the components 18.

The description will now be centered on the apparatus 23 shown in FIGS. 2 to 13 inclusive. This apparatus is provided with a support 26 for a spool 27 of wire 28, which in the present instance, is rosin core solder. The wire is threaded around a roller 30, through a first guide 31, through cooperating feeding units 32 and 33 and through a final guide 34. The feeding units 32 and 33 are of the conventional type for alternately gripping and advancing the wire measured distances so that like lengths may be cut successively from the wire to be formed into rings about the leads.

The apparatus 23 is driven by a power means, not shown, to drive a chain 36 (FIG. 3) to drive a sprocket 37 and to thereby rotate a drive plate 38. The drive shaft 39 is connected to the sprocket 37 and drive plate 38 (FIGS. 2, 4 and 5) through a clutch mechanism indicated generally at 40, in FIG. 3, operated by a solenoid 41 so that during each interval of rest when a component is in an operating station the cam shaft 39 will be driven.

Figure 5:
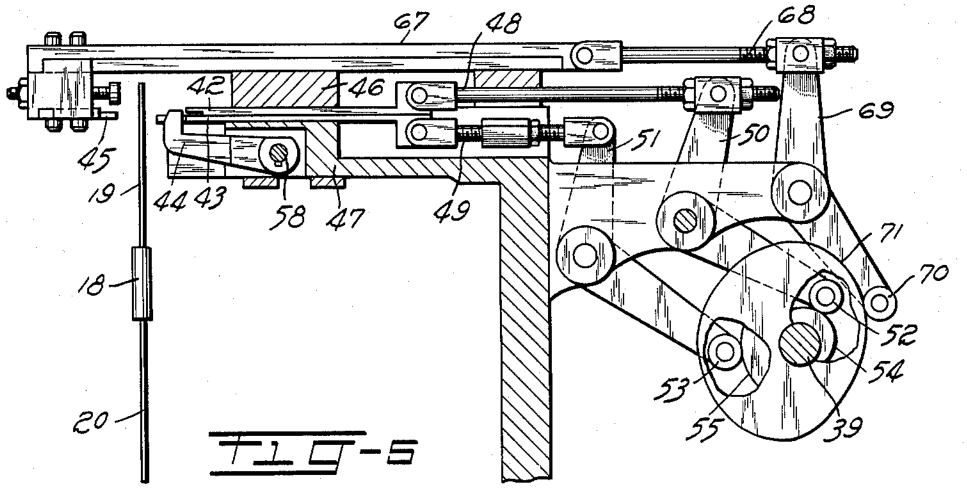
FIG. 5 is a vertical sectional view of the apparatus illustrating the forming and mounting means.

The apparatus, as seen in FIG. 5, is composed of a first forming tool 42, a transport tool 43, a second forming tool 44, and a finishing tool 45. The first forming tool 42 and transport tool 43 are positioned one upon the other and are supported in guides 46 and 47. The right ends of the first forming tool 42 and transport tool 43 are connected by adjustable rods 48 and 49 to their respective cam levers 50 and 51. These levers have cam followers 52 and 53 which are caused to ride on their respective cams 54 and 55 driven by suitable means, not shown. the cams being mounted on the cam shaft 39. The second forming tool 44 is mounted on a shaft 58 rockably supported in a bearing member 59 (FIG. 4), a lever 60 being mounted on one end of the shaft 58 and connected by an adjustable rod 61 to a cam lever 62. The cam lever 62 has a cam follower 63 caused to ride in the groove 64 of a cam 65 mounted on the cam shaft 39. The finishing tool 45 is mounted on a slide 67, as shown in FIG. 5, and connected by an adjustable rod 68 to a cam lever 69 having a cam follower 70 caused to follow the contour of a cam 71.

Figures 6, 7, 8, 9, 10, 11, 12, 13:
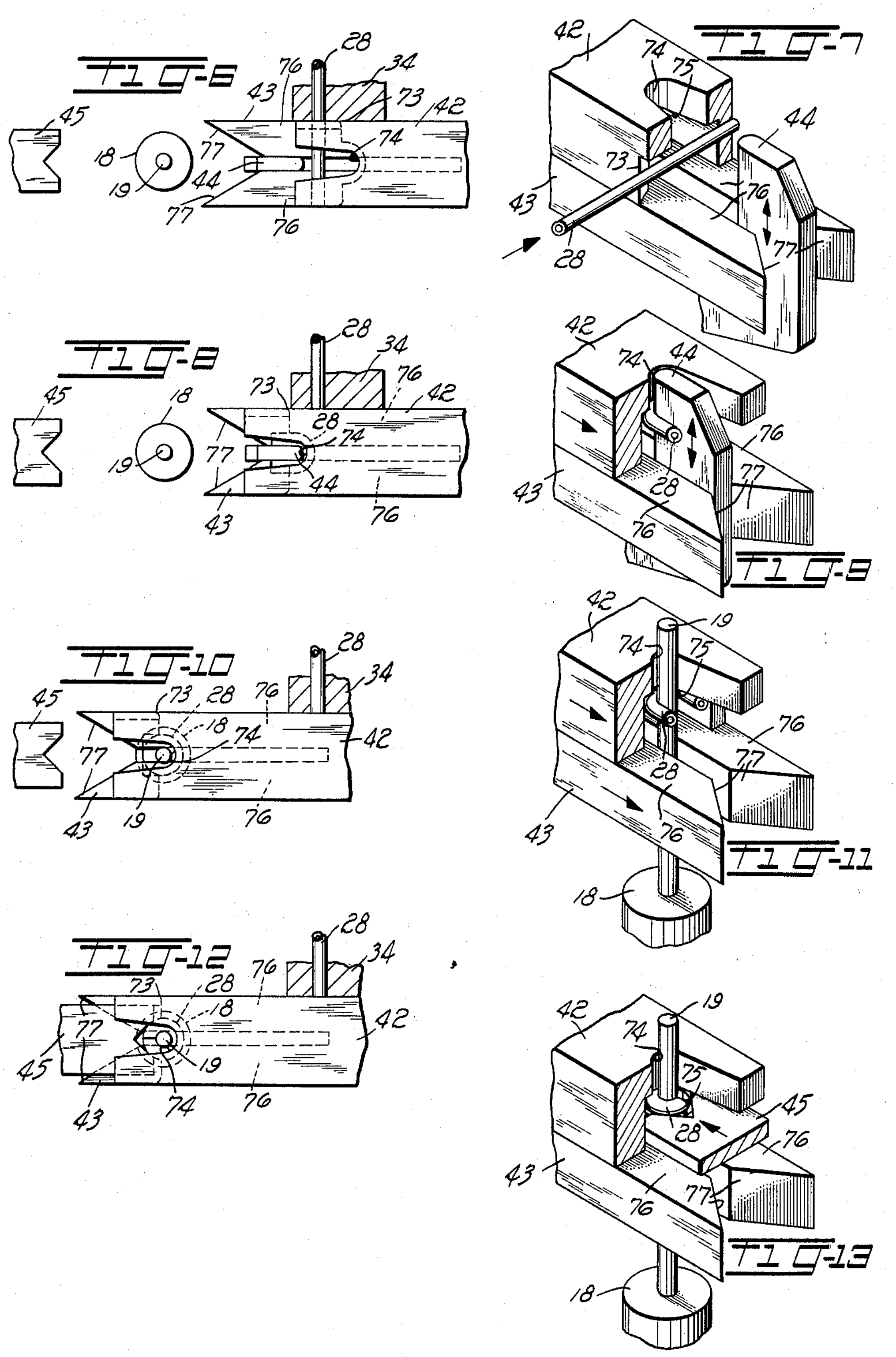
FIG. 6 is a fragmentary top plan view of portions of the apparatus in open position ready to cut a length from the solder wire.
FIG. 7 is an isometric view of that shown in FIG. 6.
FIG. 8 is a top plan view of the same structure shown in FIG. 6 after the length of solder wire has been cut and given a U-shaped bend.
FIG. 9 is an isometric view of the structure shown in FIG. 8.
FIG. 10 is a fragmentary top plan view of the same structure showing the location of the U-shaped length of solder wire moved about the component lead.
FIG. 11 is an isometric view of the structure shown in FIG. 10.
FIG. 12 is a top plan view of the same structure in closed position showing the completion of the solder ring about the lead.
FIG. 13 is an isometric view of the structure shown in FIG. 12.

Attention is now directed to FIGS. 6 to 13 inclusive, which illustrate the actions of the forming and finishing tools. In the positions shown in FIGS. 6 and 7, the tools are in their open position and the wire 28 has been advanced through the guide 34 and is ready for the start of the operating cycle of the apparatus. The second forming tool 44, of the general contour illustrated in FIG. 5, is rocked upwardly between guide fingers 76—76 of the transport tool 43 when actuated by its cam 65. Next the first forming tool 42 is moved to the left (FIG. 6). The first forming tool 42 is provided with a cutter 73 which cooperates with the guide 34 in cutting a measured length from the wire. Following this action, a U-shaped bend is formed in the length of wire around the second forming tool 44 (FIGS. 8 and 9). This necessitates a particular configuration of the first forming tool 42 having a recess 74 to receive the second forming tool 44 and a pocket 75 to receive and support the now formed U-shaped length of wire. The outer ends of legs 76—76 of the transport tool 43 have diagonal guide surfaces 77—77 for a purpose hereinafter described. After the length of wire has been given its U-shaped formation the second forming tool 44 is rocked with its shaft free of the first forming tool 42 and transport tool 43 so that during the next action these latter tools with the U-shaped length of wire may be moved to straddle the lead 19 of the component 18 disposed at the operating station (FIGS. 10 and 11), the diagonal surfaces 77—

77 serving to guide the lead 19 into the position shown in FIG. 10. Following this action, the finishing tool 45 starts its movement, through operation of the cam 71, so that when the first forming tool 42 and transport tool 43 reach the position shown in FIG. 10, the finishing tool will move into the position shown in FIGS. 12 and 13 to complete the formation of the length of wire into a ring about the lead 19.

*Operation*

Figure 2:
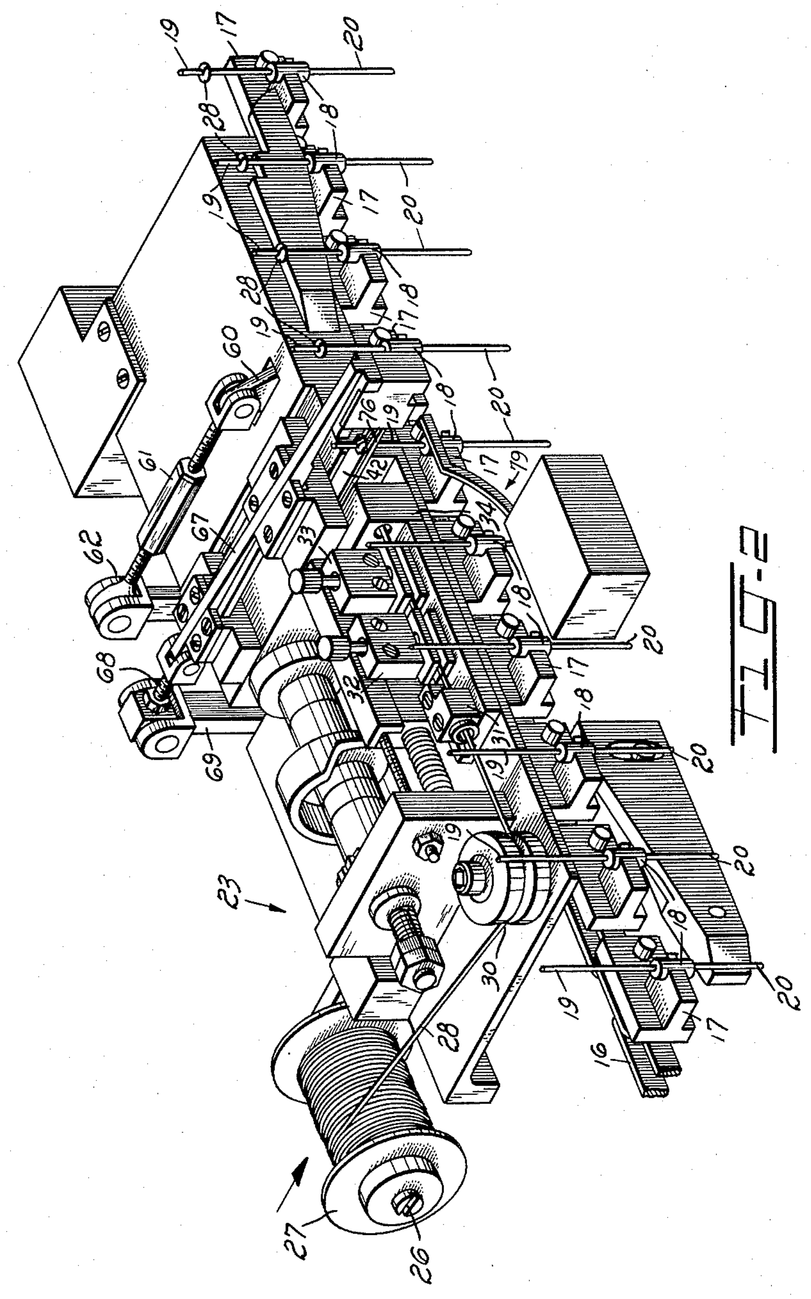
FIG. 2 is an isometric view of the apparatus.
Figure 3:
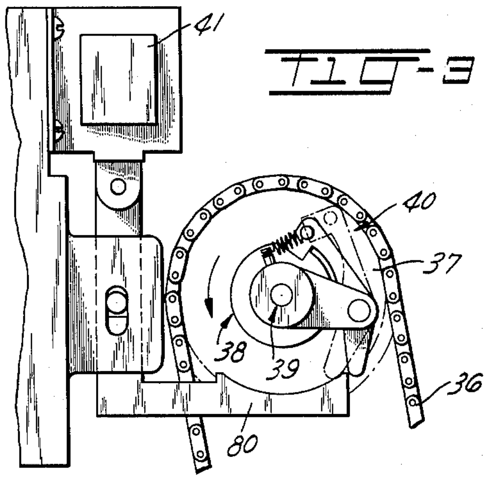
FIG. 3 is a fragmentary detailed view of a clutch controlling the driving means for the apparatus.
Figure 4:
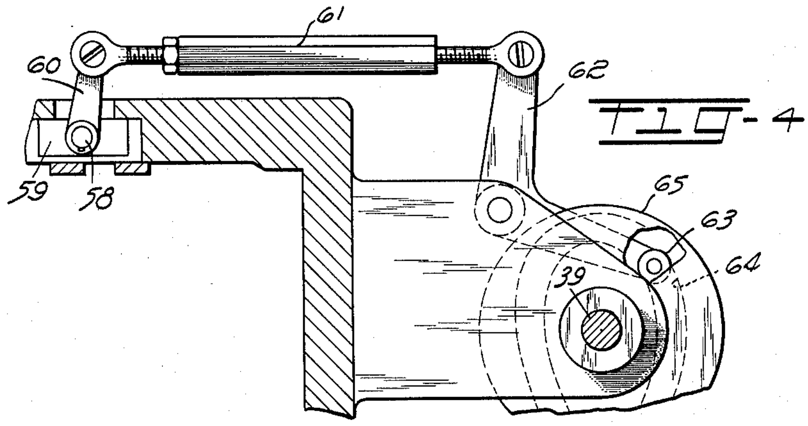
FIG. 4 is a detailed view of a cam-operated means for a forming tool of the apparatus.

During operation of the apparatus in conjunction with the machine shown in FIG. 1, it should be understood initially that through the micro switch 79 shown in FIG. 2, the solenoid 41 (FIG. 3) is operated when no component 18 is in the holder 17 to raise a clutch arm 80 on the cam shaft 39 and free the mechanism 40 to disengage the clutch to disconnect the cam shaft 39 from the drive plate 38 to make inoperative the cycle of the apparatus 23. At the beginning of each operating cycle, the length of wire 28 is advanced to the position shown in FIGS. 6 and 7. The operation of the forming tools will then begin for cutting the length of wire and forming it into a U-shape configuration where it is held in the pocket 75 of the first forming tool 42. During movement of the first forming tool 42 and transport tool 43, the U-shaped wire straddles the lead 19 at the operating station whereat it is formed into a ring about the lead through the cooperation of the first forming tool 42, transport tool 43 and the finishing tool 45.

With reference to FIG. 1, it should be apparent that in the return or lower path of the conveyor, similar solder rings will be formed and mounted on the leads 20 of the components 18 by apparatus 24 which is similar in structure and function to that of apparatus 23.

It is to be understood that the above-described arrangements are simply illustrative of the application of the principles of the invention. Numerous other arrangements may be readily devised by those skilled in the art which will embody the principles of the invention and fall within the spirit and scope thereof.

What is claimed is:

1. Apparatus for forming and mounting a solder wire ring on the lead of a component at an operating station, which comprises:
   means for feeding solder wire to the operating station,
   means for cutting a predetermined length of solder wire fed to the operating station,
   a transporting tool having a slot formed therein,
   a first forming tool disposed adjacent the transporting tool and having an arcurately shaped recess therein,
   a finishing tool located in opposing relationship to the first forming tool,
   means for feeding a component to a position between the first forming tool and finishing tool, a second forming tool cooperatively associated with the first forming tool,
   means for pivotally moving the second forming tool from a first position, through the slot of the transporting tool to a second position whereat it is in opposing relationship to the arcuate recess of the first forming tool,
   means for moving the first forming tool towards the second forming tool so as to bend the cut wire about the second forming tool to form a U-shape therein,
   means responsive to a return of the second forming tool from its second position to its first position for linearly moving the first forming tool and transporting tool simultaneously so as to straddle the lead in the slot of the transporting tool and locate the U-shaped wire about the component lead, and
   means for moving the finishing tool towards the first forming tool to engage and fully form the U-shaped wire into a ring about the component lead.

2. Apparatus for forming and mounting a solder wire ring on the lead of a component at an operating station according to claim 1 in which:
   the transporting tool is provided with an outwardly flared open end portion communicating with the slot of the transporting tool for guiding the component lead in said slot during the simultaneous linear movement of the transporting tool and first forming tool.

3. Apparatus for forming and mounting a solder wire ring on the lead of a comopnent at an operating station according to claim 1 in which:
   the cutting means is located on the first forming tool and cuts the prescribed length of solder wire from the solder wire supply during the movement of the first forming tool towards the second forming tool to form the U-shape in the cut wire.

References Cited by the Examiner

UNITED STATES PATENTS

| | | | |
|---|---|---|---|
| 2,130,779 | 9/38 | Smith et al. | 1—177 |

FOREIGN PATENTS

| | | |
|---|---|---|
| 1,298,076 | 5/62 | France. |
| 406,553 | 11/24 | Germany. |
| 958,288 | 2/57 | Germany. |

OTHER REFERENCES

Keller (German printed application), K–14,161–I*b/7d*, Dec. 22, 1955.

CHARLES W. LANHAM, *Primary Examiner.*